United States Patent
Choi et al.

(10) Patent No.: US 9,041,032 B2
(45) Date of Patent: May 26, 2015

(54) LIGHT EMITTING DIODE HAVING STRAIN-ENHANCED WELL LAYER

(75) Inventors: Joo Won Choi, Ansan-si (KR); Yoo Dae Han, Ansan-si (KR); Jeong Hun Heo, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 71 days.

(21) Appl. No.: 13/484,120

(22) Filed: May 30, 2012

(65) Prior Publication Data

US 2013/0134386 A1 May 30, 2013

Related U.S. Application Data

(60) Provisional application No. 61/492,541, filed on Jun. 2, 2011.

(51) Int. Cl.
- *H01L 33/00* (2010.01)
- *H01L 33/04* (2010.01)
- *H01L 33/06* (2010.01)
- *B82Y 20/00* (2011.01)
- *B82Y 99/00* (2011.01)

(52) U.S. Cl.
CPC .............. *H01L 33/04* (2013.01); *Y10S 977/773* (2013.01); *B82Y 99/00* (2013.01); *H01L 33/06* (2013.01); *B82Y 20/00* (2013.01)

(58) Field of Classification Search
CPC ................... H01L 33/03044; H01L 31/03046; H01L 2924/12041
USPC ..................................... 257/98–100
See application file for complete search history.

(56) References Cited

U.S. PATENT DOCUMENTS

| | | | | |
|---|---|---|---|---|
| 6,943,381 B2 * | 9/2005 | Gardner et al. | ................ | 257/103 |
| 2008/0237570 A1 * | 10/2008 | Choi et al. | ....................... | 257/13 |
| 2010/0187496 A1 * | 7/2010 | Yan | ................................ | 257/13 |

* cited by examiner

*Primary Examiner* — Samuel Gebremariam
(74) *Attorney, Agent, or Firm* — H.C. Park & Associates, PLC

(57) ABSTRACT

An exemplary embodiment of the present invention includes a light emitting diode including a strain-enhanced well layer. The light emitting diode includes an n-contact layer, an active layer having a barrier layer and a well layer, a p-contact layer, and a strain-enhancing layer configured to enhance a strain applied to the well layer.

19 Claims, 6 Drawing Sheets

(a) Normal energy band diagram (b) Strained

LIGHT EMITTING DIODE HAVING STRAIN-ENHANCED WELL LAYER

CROSS REFERENCE TO RELATED APPLICATION

This application claims the benefit of U.S. Provisional Patent Application No. 61/492,541, filed on Jun. 2, 2011, which is hereby incorporated by reference for all purposes as if fully set forth herein.

BACKGROUND OF THE INVENTION

1. Field of the Invention

The present invention relates to a light emitting diode, and more particular, to a light emitting diode having a strain-enhanced well layer.

2. Discussion of the Background

Generally, a Group III-V nitride-based laser diode/light-emitting diode (LD/LED) includes an $In_xGa_{1-x}N$ buffer layer, an n-GaN layer, an active layer having a quantum-well structure of InGaN/GaN, a p-AlGaN electron blocking layer, and a p-GaN layer, which are sequentially formed on a patterned sapphire substrate having a c-plane (0001).

In a general $GaN/In_{0.15}Ga_{0.75}N$ quantum-well structure, an InGaN well layer has compressive strain of about 1.6%. In the related art, since strain applied to an active layer has been considered to deteriorate efficiency, a strain relieving technique has been developed.

On the other hand, a high brightness LED undergoes a droop phenomenon wherein optical output efficiency decreases with increasing drive current. Therefore, there is a need to relieve the droop phenomenon of a light emitting diode in order to obtain high optical efficiency at high drive current.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a light emitting diode capable of relieving a droop phenomenon as drive current increases.

Exemplary embodiments of the present invention also provide a light emitting diode which includes an n-contact layer, an active layer having a barrier layer and a well layer, a p-contact layer, and a strain-enhancing layer enhancing strain applied to the well layer.

Additional features of the invention will be set forth in the description which follows, and in part will be apparent from the description, or may be learned by practice of the invention.

An exemplary embodiment of the present invention discloses an n-contact layer, a p-contact layer, and an active layer including a barrier layer and a well layer, the active layer being arranged between the n-contact layer and the p-contact, and a strain-enhancing layer configured to enhance a strain applied to the well layer.

An exemplary embodiment of the present invention also discloses a first-type contact layer, a second-type contact layer, an active layer including a barrier layer and a well layer, the active layer being arranged between the first-type contact layer and the second-type contact layer, and a strain-enhancing layer configured to provide a compressive strain to the well layer, the strain-enhancing layer comprising a lattice constant lower than a lattice constant of the barrier layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
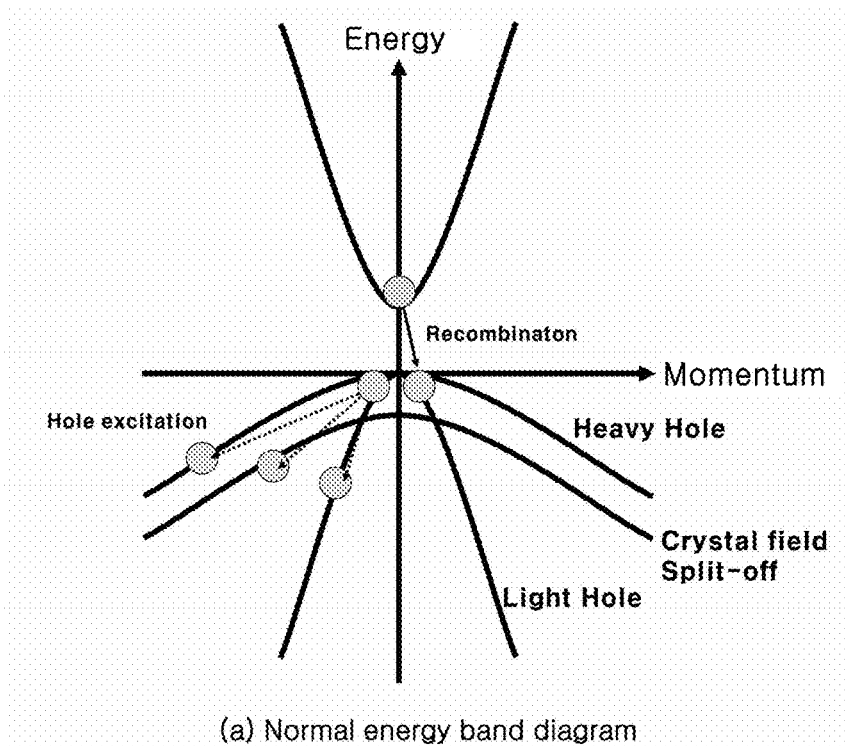
FIG. 1 shows graphs illustrating an energy band of a GaN-based semiconductor according to strain, in which (a) is a graph of an energy band of the GaN-based semiconductor when strain is not applied thereto, and (b) is a graph of an energy band of the GaN-based semiconductor when strain is applied thereto.
Figure 1:
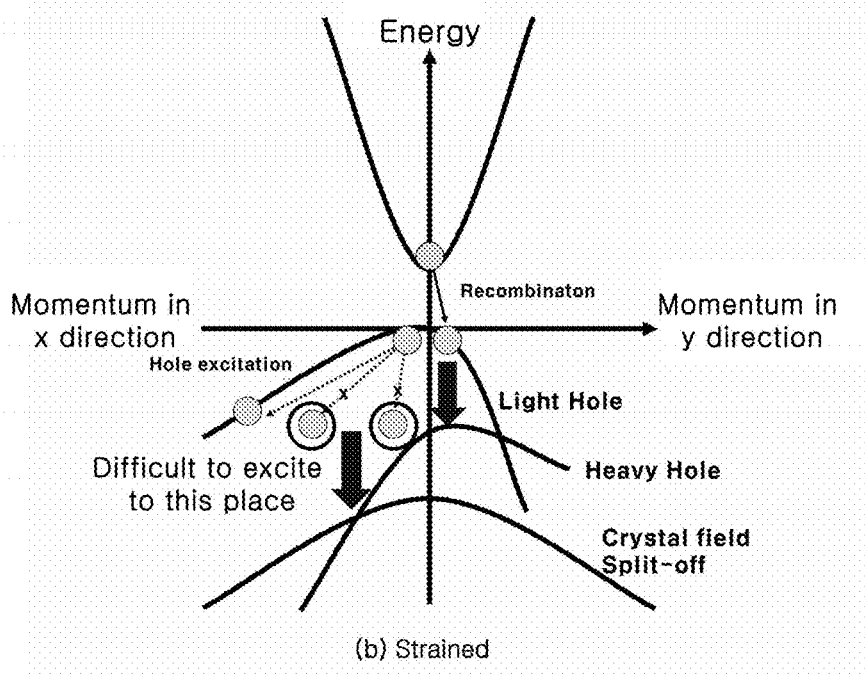

The invention is described more fully hereinafter with reference to the is accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, various exemplary embodiments configured to enhance strain applied to a well layer to prevent a droop phenomenon will be described. Herein, the well layer is not limited to a polar epitaxial layer grown on the c-plane and may include all non-polar and semi-polar (m-plane, a-plane, r-plane) epitaxial layers, as described above.

FIG. 1 shows graphs illustrating a conduction band and a valance band of an active layer in an energy-momentum space. FIG. 1(a) shows an energy band in a normal state of the active layer and FIG. 1(b) shows an energy band when uniaxial strain is applied to the active layer. In a normal state, since a difference between energy levels of holes is not significant, the holes can be easily excited, thereby promoting a droop phenomenon caused by Auger recombination upon driving at high current. However, when strain is applied to the active layer, the difference between energy levels becomes significant, thereby decreasing a possibility that holes can transit to a higher energy level. In other words, as shown in FIG. 1(b), when the active layer is subjected to uniaxial strain, the difference between energy levels in a uniaxial direction rapidly increase, making it difficult for holes to excite to a higher energy level. The difference between energy levels increases upon application of biaxial strain. When the difference between energy levels increases, the Auger recombination rate is reduced, thereby enabling a reduction of the droop phenomenon caused by the Auger recombination.

Figure 2:
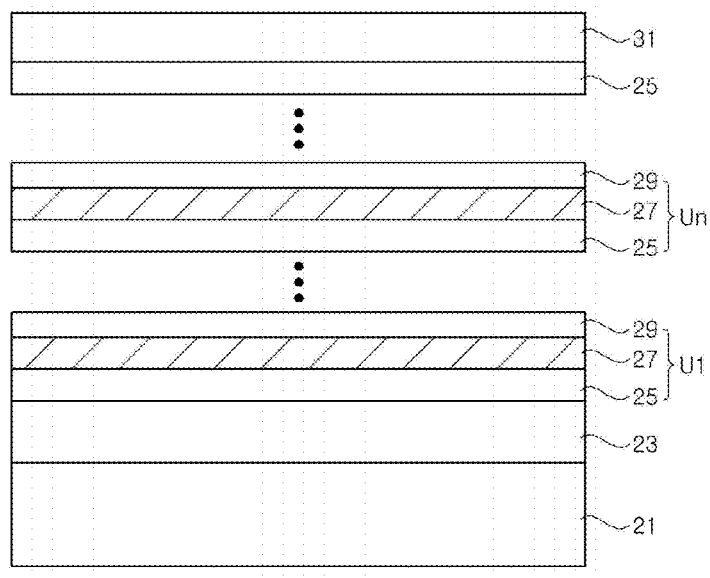
FIG. 2 is a schematic sectional view of a light emitting diode according to an exemplary embodiment of the present invention.

FIG. 2 is a schematic sectional view of a light emitting diode according to an exemplary embodiment of the present invention.

Referring to FIG. 2, an n-GaN layer 23, for example an n-contact layer, is formed on a substrate 21, and a unit U1 including a barrier layer 25, a strain-enhancing layer 27 and a well layer 29 is periodically and repeatedly stacked on the n-GaN layer 23 to form a multiple-quantum well structure. The multiple-quantum well structure may include Un units. The uppermost layer of the multiple-quantum well structure may be the barrier layer 25, the well layer 29, or the strain-enhancing layer 27. A p-GaN layer 31, for example a p-contact layer, is formed on the multi-quantum well structure. An electron blocking layer (not shown) may be interposed between the quantum well structure and the p-GaN layer 31.

The barrier layer 25 has a composition that provides a lower band gap than that of the well layer 29. For example, the well layer may be InGaN and the barrier layer may be GaN. A compositional difference between the barrier layer 25 and the well layer 29 generally applies compressive strain to the well layer 29. The strain-enhancing layer 27 may be formed of an InAlGaN-based nitride semiconductor having a lower lattice constant than that of the barrier layer 25. Thus, the strain-enhancing layer 27 is configured to enhance strain, for example compressive strain, applied to the well layer 29. The strain-enhancing layer 27 may have a composition that provides higher compressive strain to the well layer 29 than the compressive strain provided to the well layer 29 from the barrier layer 25.

Figure 3:
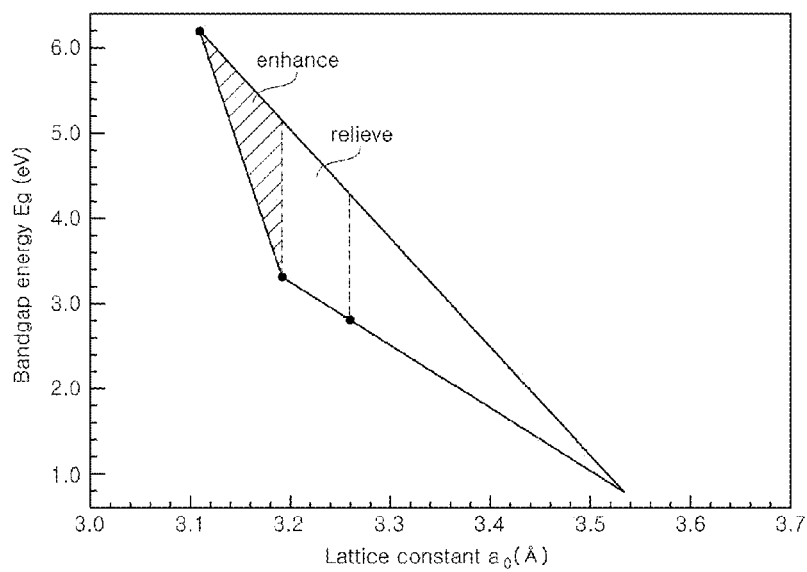
FIG. 3 is a schematic graph illustrating a composition region for a strain-enhancing layer.

FIG. 3 is a schematic graph illustrating a composition region for the strain-enhancing layer, from which a bowing parameter is omitted.

As shown in FIG. 3, a GaN-based semiconductor has a composition range in a triangular-shaped region based on AlN, GaN, and InN. If the barrier layer 25 is composed of GaN, a composition in a region having a lattice constant that is lower than that of GaN becomes the strain-enhancing layer 27. For example, when the barrier layer 25 is a GaN layer and the well layer 29 is an InGaN layer, the strain-enhancing layer 27 may be formed of an InAlGaN-based nitride semiconductor which has a lower lattice constant than GaN. Further, a semiconductor layer in a composition region which has a lattice constant between those of the well layer 29 and the barrier layer 25 will relieve strain applied to the well layer 29.

Thus, when a GaN-based strain-enhancing layer having a lower lattice constant than that of the barrier layer 25 is arranged between the barrier layer 25 and the well layer 29, enhanced strain may be applied to the well layer 29, thereby relieving the droop phenomenon.

The well layer 29 may be formed to a thickness of 3 nm or more. The upper limit of the well layer 29 may be selected from the critical thickness or less thereof. For example, the well layer 29 may have a thickness of 10 nm or less, particularly, 7 nm or less.

Figure 4:
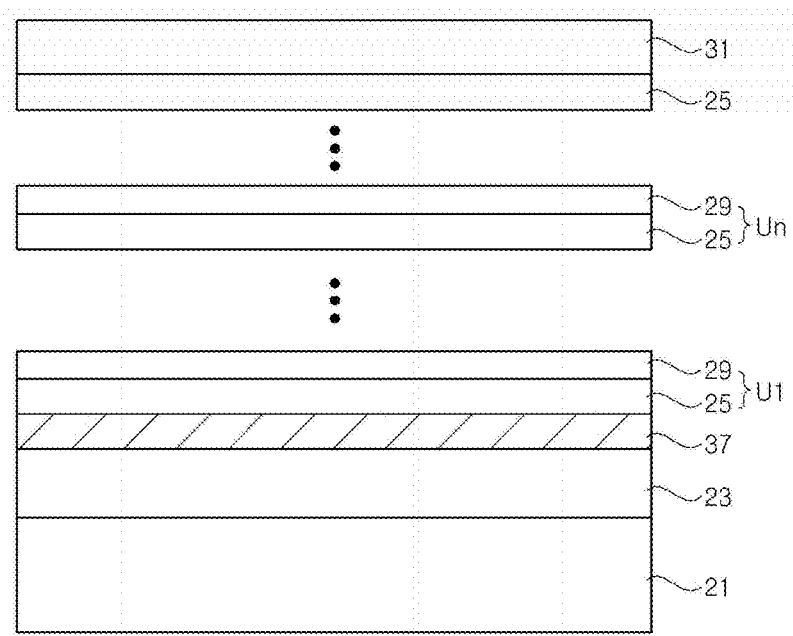
FIG. 4 is a schematic sectional view of a light emitting diode according to an exemplary embodiment of the present invention.

FIG. 4 is a schematic sectional view of a light emitting diode according to an exemplary embodiment of the present invention. A detailed description of the same components as those described above with reference to FIG. 2 will be omitted.

Referring to FIG. 4, a light emitting diode according to the present exemplary embodiment has an active layer having a multiple-quantum well structure, in which a barrier layer 25 and a well layer 29 are periodically formed, and a strain-enhancing layer 37 positioned between the quantum well structure unit U1 and an n-GaN layer 23. As described above with reference to FIGS. 2 and 3, the strain-enhancing layer 37 is configured to enhance strain applied to the well layer 29. Namely, the strain-enhancing layer 37 may be formed of an InAlGaN-based semiconductor having the same composition as that of the strain-enhancing layer 27 shown in FIG. 2.

Figure 5:
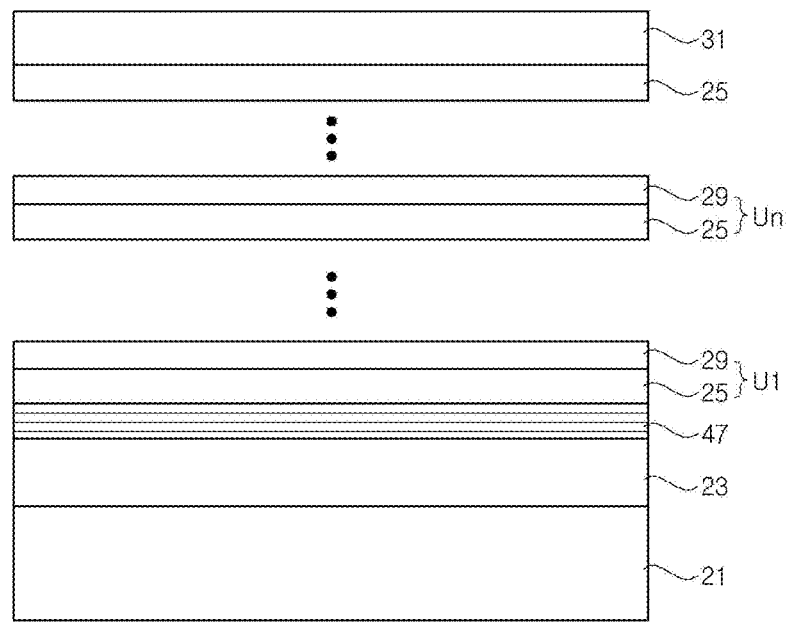
FIG. 5 is a schematic sectional view of a light emitting diode according to an exemplary embodiment of the present invention.

FIG. 5 is a schematic sectional view of a light emitting diode according to an exemplary embodiment of the present invention.

Referring to FIG. 5, a light emitting diode according to the present exemplary embodiment is generally similar to the light emitting diode of FIG. 4, except for a strain-enhancing layer 47 having a super lattice structure. For example, the strain-enhancing layer 47 may have a super lattice structure which is formed by alternately stacking nitride semiconductor is layers having different compositions. The strain-enhancing layer 47 is configured to apply compressive strain to the barrier layer 25. For example, when the barrier layer is GaN, the strain-enhancing layer 47 may be formed by repeatedly stacking InAlGaN/InAlGaN. Here, the InAlGaN/InAlGaN has a lattice constant that is lower than that of the GaN of the barrier layer 25, so that the strain-enhancing layer 47 applies compressive strain to the barrier layer 25, thereby enhancing strain applied to the well layer 29. That is, the strain-enhancing layer 47 having a super lattice structure together with the barrier layer 25 may generally provide higher compressive strain to the well layer 29 than the barrier layer 25 alone.

Figure 6:
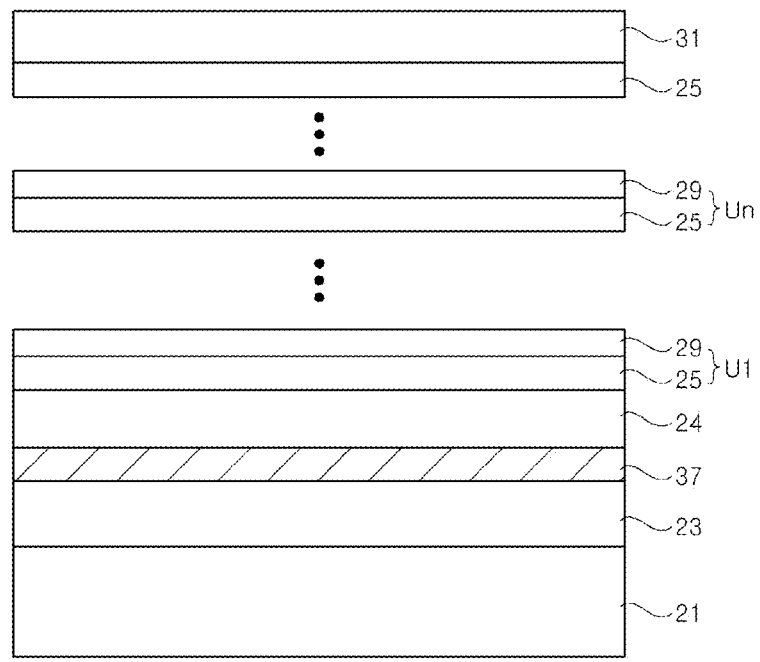
FIG. 6 is a schematic sectional view of a light emitting diode according to an exemplary embodiment of the present invention.

FIG. 6 is a schematic sectional view of a light emitting diode according to an exemplary embodiment of the present invention.

Referring to FIG. 6, a light emitting diode according to the present exemplary embodiment is generally similar to the light emitting diode according to the embodiment described above with respect to FIG. 2 except that the light emitting diode of the present exemplary embodiment further comprises an electron injection layer 24 between the strain-enhancing layer 37 and the active layer (the multiple-quantum well structure that includes the well layer 29 and the barrier layer 25). The electron injection layer 24 injects electrons into the active layer U1, and may be formed of an n-type semiconductor layer. The electron injection layer 24 can be formed of a gallium nitride based semiconductor layer with a same compositional ratio to the n-contact layer 23, for example a GaN layer, but is not limited thereto. The electron injection layer 24 may also have a super lattice structure.

The electron injection layer 24 has a sufficient thickness to inject electrons into the active layer. Meanwhile, since the electron injection layer 24 has a larger lattice constant than the strain-enhancing layer 37, the electron injection layer 24 may weaken strain induced to is the well layer 29 by the strain-enhancing layer 37. Thus, the electron injection layer has a sufficiently thin thickness such that strain can be induced to the well layer 29 by the strain-enhancing layer 37. The thickness of the electron injection layer 24 can be tuned with a doping concentration of n-type impurities doped to the electron injection layer 24 and a compositional ratio of the strain-enhancing layer 37, and it may be between about 300 nm and about 600 nm.

Figure 7:
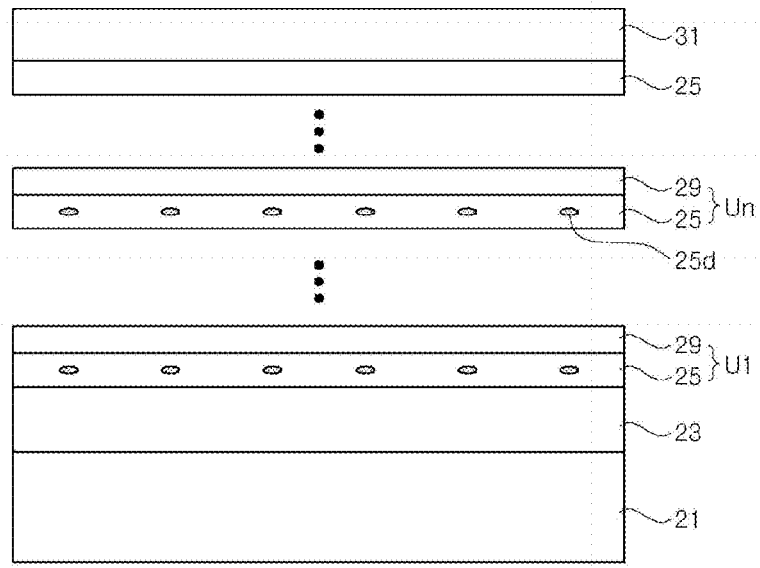
FIG. 7 is a schematic sectional view of a light emitting diode according to an exemplary embodiment of the present invention.

FIG. 7 is a schematic sectional view of a light emitting diode according to an exemplary embodiment of the present invention.

Referring to FIG. 7, as described above with respect to the exemplary embodiment shown in FIG. 2, a light emitting diode according to the present exemplary embodiment includes a substrate 21, an n-GaN layer 23, an active layer having a quantum well structure in which a unit U1 of a barrier layer 25 and a well layer 29 is repeatedly stacked, and a p-GaN layer 31. In the light emitting diode according to the present exemplary embodiment, the barrier layer 25 including quantum dots 25d is formed instead of the strain-enhancing layer 27 arranged between the barrier layer 25 and the well layer 29.

Namely, when the barrier layer 25 is formed, the quantum dots 25d are formed in the barrier layer 25 to enhance strain applied to the well layer 29. The quantum dots 25d have a lattice constant that is lower than that of the barrier layer 25. Such a composition of the quantum dots 25d is selected in the strain enhancing region of FIG. 3.

Figure 8:
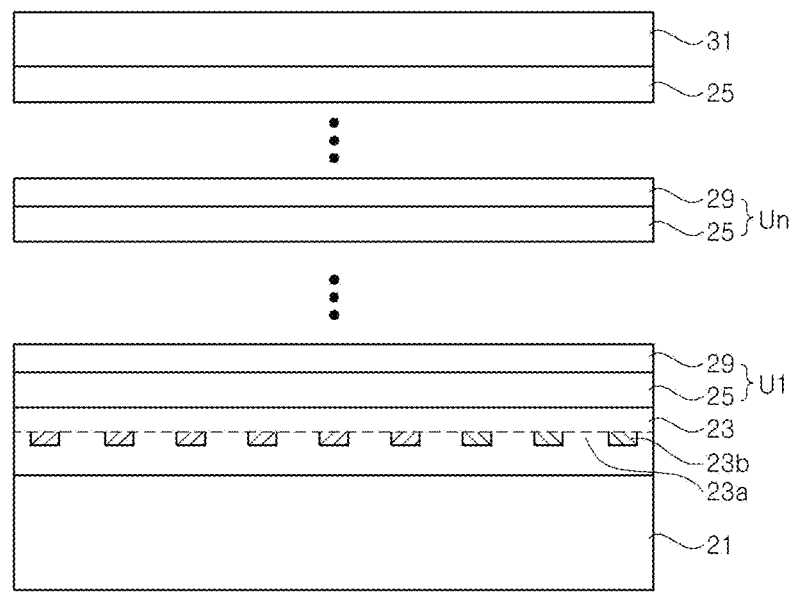
FIG. 8 is a schematic sectional view of a light emitting diode according to an exemplary embodiment of the present invention.

FIG. 8 is a schematic sectional view of a light emitting diode according to an exemplary embodiment of the present invention.

Referring to FIG. 8, as described above with respect to the exemplary embodiment shown in FIG. 2, a light emitting diode according to the present exemplary embodiment includes a substrate 21, an n-GaN layer 23, an active layer of a quantum well structure in which a unit U1 is of a barrier layer 25 and a well layer 29 is repeatedly stacked, and a p-GaN layer 31. In the light emitting diode according to the present exemplary embodiment, a pattern 23a is formed in the n-GaN layer 23 and used for growth of the n-GaN layer 23 to enhance compressive strain applied to the well layer 29, instead of the strain-enhancing layer 27 arranged between the barrier layer 25 and the well layer 29.

Figure 9:
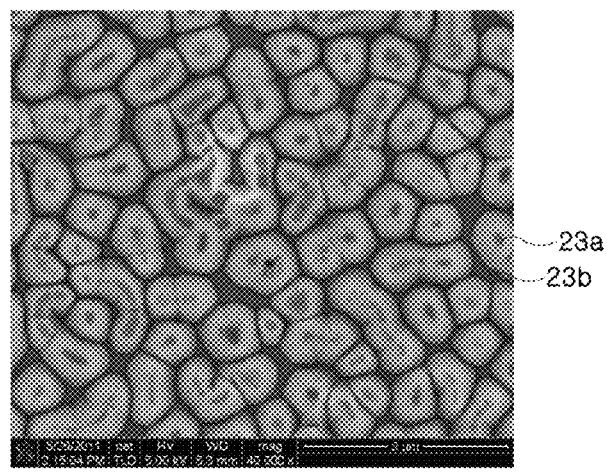
FIG. 9 is a scanning electron microscope (SEM) micrograph showing a surface of a GaN layer subjected to etching using a random pattern of metal.

After growing part of the n-GaN layer 23, the grown part of the n-GaN layer 23 is patterned to form protrusions 23a and concave portions 23b between the protrusions 23a as shown in FIG. 9. Then, the remaining part of the n-GaN layer 23 is grown using planar surfaces of the protrusions 23a. Accordingly, an n-GaN layer 23 having regions with dislocations is formed on regions corresponding to the protrusions 23a, and the n-GaN layer 23 having regions with good crystallinity is formed above the concave portions 23b by lateral growth.

Since the regions of the n-GaN layer 23 having dislocations and the regions having good crystallinity are arranged adjacent to each other, it is possible to apply compressive strain to a semiconductor layer, for example, a barrier layer 25, on the n-GaN layer 23, thereby enabling enhancement of compressive strain applied to the well layer 29.

The protrusions 23a may have an irregular shape as shown in FIG. 9. The protrusions 23a may be formed by irregularly distributing metal particles such as Ni on a partially grown n-GaN layer, patterning the n-GaN layer using the metal particles as an etching mask, and then removing the metal particles. As a result, the concave portions 23b are formed between the protrusions 23a.

In order to enhance compressive strain applied to the well layer 29, the width of the protrusions 23a and the distance between the protrusions 23a are less than about 1 μm. In particular, these dimensions may be a nano scale less than the wavelength of light generated is from the well layer 29. That is, the width of the protrusions 23a and the distance between the protrusions 23a may have a nanoscopic scale. If the distance between the protrusions 23a is equal to or greater than 1 μm, it is difficult to achieve rapid growth of a flat n-GaN layer 23 through lateral growth and to enhance compressive strain applied to the well layer 29. Further, if the width of the protrusions 23a is greater than 1 μm, it is difficult to enhance compressive strain applied to the well layer 29.

The distance between the protrusions 23a and the active layer may be determined in consideration of the critical thickness of the n-GaN layer 23, and may not be more than about 400 nm. If the distance between the protrusions 23a and the active layer exceeds 400 nm, the effect of the protrusions 23a cannot be obtained. Here, the distance between the protrusions 23a and the active layer is at least 10 nm or more in order to improve lateral growth on the protrusions 23a.

In the present exemplary embodiment, the protrusions 23a may be separated from each other and the concave portions 23b may be connected to each other. Alternatively, the protrusions 23a may be connected to each other and the concave portions 23b may be separated from each other.

Further, although the protrusions 23a are illustrated as being formed in an irregular shape in the present exemplary embodiment, the present invention is not limited thereto. In another exemplary embodiment, the protrusions 23a may be formed in a regular shape. The protrusions 23a may have a hexagonal prism or hexagonal pyramid shape and be regularly arranged in two dimensions. Such regular arrangement of the protrusions permits uniform distribution of the dislocation regions and the good crystallinity regions in the n-GaN layer 23.

The protrusions 23a may have flat upper surfaces to allow the n-GaN layer 23 to be grown on the protrusions 23a. Furthermore, the concave portions 23b between the protrusions 23a may remain as a vacant space or may be filled with a different material from the n-GaN layer 23, for example, an insulating material or metallic material such as Ag. For example, after forming the protrusions 23a and the concave portions 23b by patterning the n-GaN using Ni as an etching mask, a metal layer may be formed to fill the concave portions 23b before removing Ni, and the metal is then removed together with Ni from upper surfaces of the protrusions 23a, so that the concavities 23b may be filled with the metal.

EXPERIMENTAL EXAMPLE

Both a light emitting diode (AlGaN under) having a structure similar to the light emitting diode described above with respect to the exemplary embodiment shown in FIG. 6 and a light emitting diode (Reference) without a strain-enhancing layer were fabricated to compare changes in the droop characteristics due to an employment of the strain-enhancing layer.

The light emitting diode (AlGaN under) according to an exemplary embodiment of the present invention was fabricated by growing 2 μm of an undoped GaN layer, 2 μm of an Si-doped GaN layer, 20 nm of $Al_{0.25}Ga_{0.75}N$ layer (a strain-enhancing layer), about 500 nm of an electron injection layer, an active layer with 6 periods of a barrier layer and a well layer, a Mg-doped AlGaN electron blocking layer and a Mg-doped GaN layer. Meanwhile, a light emitting diode was fabricated as a reference without the strain-enhancing layer and the electron injection layer.

Figure 10:
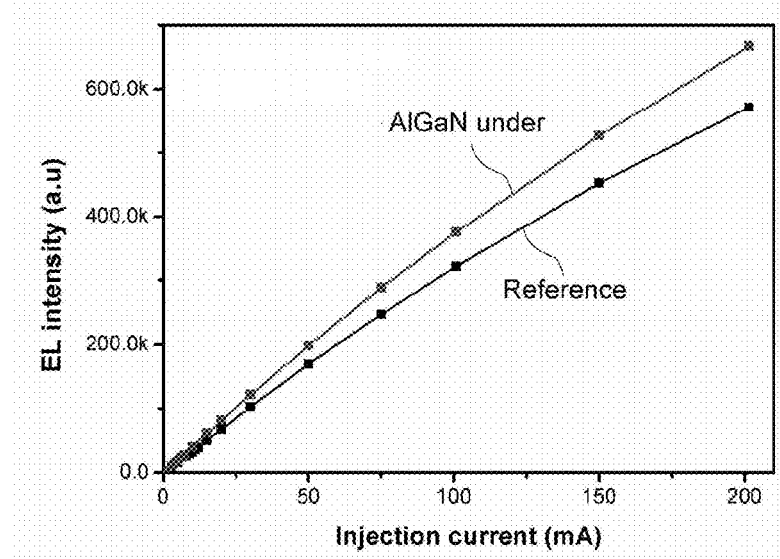
FIG. 10 is a graph showing change of electro luminescence (EL) intensity due to using a strain-enhancing layer.

Each of the light emitting diodes was fabricated as a chip having an area of 600×600 um² to measure electrical and optical characteristics thereof. A pulse source with a pulse period of 100 ns and a duty cycle of 10% was used to exclude thermal effect. FIG. 10 is shows optical characteristics with currents, and FIG. 11 shows normalized external quantum efficiency with currents.

Figure 11:
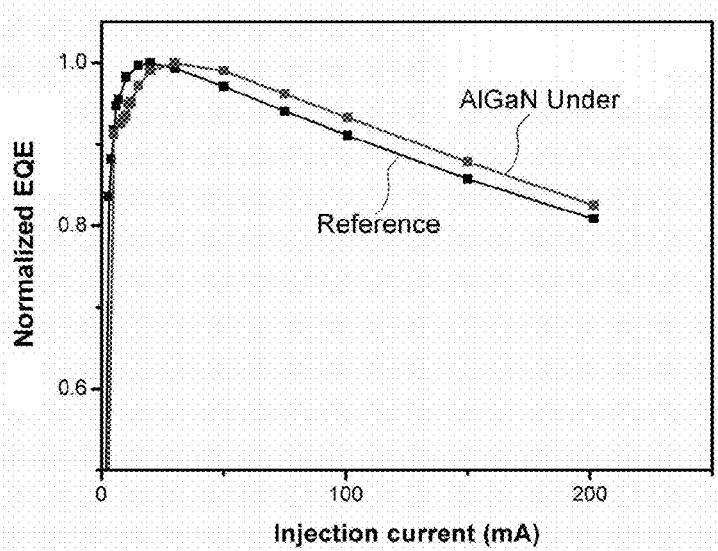
FIG. 11 is a graph showing change of external quantum efficiency (EQE) due to using a strain-enhancing layer.

Referring to FIG. 10 and FIG. 11, it can be seen that as current increases the light emitting diode (GaN under) of the exemplary embodiment with the strain-enhanced well layer shows a higher electro-luminescent (EL) intensity and a lesser decrease in the external quantum efficiency than the light emitting diode of the reference.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. A light emitting diode, comprising:
an n-contact layer;
a p-contact layer;
an active layer comprising a barrier layer and a well layer, the active layer being arranged between the n-contact layer and the p-contact layer; and
a strain-enhancing layer comprising the barrier layer and InAlGaN-based quantum dots disposed in the barrier layer, the strain-enhancing layer configured to increase a strain applied to the well layer.
2. The light emitting diode of claim 1, wherein the barrier layer and the well layer each comprise a GaN based compound semiconductor.
3. The light emitting diode of claim 2, wherein the strain-enhancing layer is arranged between the barrier layer and the well layer or between the n-contact layer and the barrier layer, and wherein the strain-enhancing layer comprises a GaN based compound semiconductor configured to provide a higher compressive strain to the well layer than a compressive strain to the well layer from the barrier layer alone.
4. The light emitting diode of claim 3, wherein the barrier layer comprises a GaN layer, the well layer comprises an InGaN layer, and the strain-enhancing layer comprises InAlGaN.
5. The light emitting diode of claim 3, wherein the strain-enhancing layer comprises a super lattice structure.
6. The light emitting diode of claim 2, further comprising:
an electron injection layer arranged between the strain-enhancing layer and the active layer,
wherein the strain-enhancing layer is arranged between the n-contact layer and the active layer.
7. The light emitting diode of claim 6, wherein the strain-enhancing layer comprises AlGaN, and the electron injection layer comprises n-GaN.
8. The light emitting diode of claim 1, wherein the quantum dots comprise a lattice constant less than that of the barrier layer.
9. The light emitting diode of claim 1, further comprising a substrate disposed below the n-type contact layer,
wherein the strain-enhancing layer is arranged between the active layer and the substrate, and the strain-enhancing layer comprises a GaN based semiconductor layer comprising a pattern.
10. The light emitting diode of claim 9, wherein the pattern is integrally formed in the n-contact layer.
11. A light emitting diode, comprising:
a first-type contact layer;
a second-type contact layer;
an active layer comprising a barrier layer and a well layer, the active layer being arranged between the first-type contact layer and the second-type contact layer; and
a strain-enhancing layer disposed between the barrier layer and the well layer, and configured to increase a compressive strain applied to the well layer, the strain-enhancing layer comprising a lattice constant lower than a lattice constant of the barrier layer.
12. The light emitting diode of claim 11, wherein the strain-enhancing layer comprises InAlGaN, the barrier layer comprises GaN, and the well layer comprises InGaN.
13. The light emitting diode of claim 11, wherein the strain-enhancing layer comprises a super lattice structure.
14. The light emitting diode of claim 13, wherein the strain-enhancing layer comprises InAlGaN/InAlGaN and the barrier layer comprises GaN.
15. The light emitting diode of claim 11, wherein the strain-enhancing layer comprises quantum dots.
16. The light emitting diode of claim 11, wherein the barrier layer comprises quantum dots.
17. The light emitting diode of claim 11, wherein the strain-enhancing layer comprises a patterned n-GaN layer.
18. The light emitting diode of claim 17, wherein the patterned n-GaN layer comprises dislocation regions and crystalline regions.
19. A light emitting diode, comprising:
a first-type contact layer;
a second-type contact layer;
an active layer comprising a barrier layer and a well layer, the active layer being disposed between the first-type contact layer and the second-type contact layer; and
a strain-enhancing layer disposed in the barrier layer and comprising quantum dots, the strain-enhancing layer configured to increase a compressive strain applied to the well layer and comprising a lattice constant lower than a lattice constant of the barrier layer.

* * * * *